US012658902B2

(12) United States Patent
Rao et al.

(10) Patent No.: US 12,658,902 B2
(45) Date of Patent: Jun. 16, 2026

(54) CLOCK RECEIVER CIRCUIT WITH RAPID CLOCK SIGNAL SETTLING

(71) Applicant: APPLE INC., Cupertino, CA (US)

(72) Inventors: Battaje Vimalesh Rao, San Marcos, CA (US); Jacob S Schneider, San Diego, CA (US); Hanan Cohen, San Diego, CA (US)

(73) Assignee: Apple Inc., Cupertino, CA (US)

( * ) Notice: Subject to any disclaimer, the term of this patent is extended or adjusted under 35 U.S.C. 154(b) by 22 days.

(21) Appl. No.: 18/962,241

(22) Filed: Nov. 27, 2024

(65) Prior Publication Data

US 2026/0095169 A1      Apr. 2, 2026

Related U.S. Application Data

(60) Provisional application No. 63/700,647, filed on Sep. 28, 2024.

(51) Int. Cl.
H03K 3/01          (2006.01)
H03K 3/017          (2006.01)
(Continued)

(52) U.S. Cl.
CPC ........... H03K 5/1565 (2013.01); H03K 3/017 (2013.01); H03K 2005/00097 (2013.01); H03L 7/08 (2013.01)

(58) Field of Classification Search
CPC .......... H03K 3/01; H03K 3/013; H03K 3/017; H03K 5/003; H03K 5/02; H03K 5/04; H03K 5/125; H03K 5/1252; H03K 5/156;

H03K 5/1565; H03K 7/08; H03K 2005/00097; H03L 7/08; H03L 7/0805; G06F 1/04; G06F 1/06; G06F 1/08
See application file for complete search history.

(56) References Cited

U.S. PATENT DOCUMENTS

| | | |
|---|---|---|
| 5,491,441 A | 2/1996 | Goetschel et al. |
| 7,199,632 B2 * | 4/2007 | Chun ................... H03K 5/1565 |
| | | 327/175 |

(Continued)

FOREIGN PATENT DOCUMENTS

| | | |
|---|---|---|
| CN | 209448709 U | 9/2019 |
| JP | 2015046740 A | 3/2015 |
| JP | 2019057844 A | 4/2019 |

*Primary Examiner* — Long Nguyen
(74) *Attorney, Agent, or Firm* — DICKINSON WRIGHT RLLP

(57) ABSTRACT

A circuit for reducing duty cycle distortion of a clock signal includes an amplifier configured to receive an input clock signal and generate an amplified clock signal. The circuit also includes a filter coupled to the amplifier and configured to generate a filtered clock signal based on the amplified clock signal. The circuit also includes a gating circuit coupled to the filter and configured to receive the filtered clock signal and selectively output the filter clock signal responsive to a first control signal. The circuit also includes a control circuit coupled to the gating circuit and the filter, where the control circuit is configured to receive a timing signal, receive an enable signal, and generate the first and a second control signal based on the timing and enable signals. The second control signal alters impedance of a feedback path of the filter.

20 Claims, 8 Drawing Sheets

(51) Int. Cl.
     *H03K 5/156*     (2006.01)
     *H03K 5/00*      (2006.01)
     *H03L 7/08*      (2006.01)

(56)                References Cited

U.S. PATENT DOCUMENTS

|  | | | |
|---|---|---|---|
| 8,513,997 | B2 | 8/2013 | Hesen et al. |
| 9,154,082 | B2 | 10/2015 | Takahashi et al. |
| 11,303,282 | B1 | 4/2022 | Kenney |
| 11,658,644 | B2 * | 5/2023 | Soltesz .................. H03K 3/017 |
|  | | | 327/175 |
| 2011/0012664 | A1 | 1/2011 | Kinoshita et al. |
| 2012/0081163 | A1 | 4/2012 | Hesen et al. |
| 2015/0222232 | A1 | 8/2015 | Takahashi et al. |
| 2024/0022211 | A1 | 1/2024 | Nishioka |

* cited by examiner

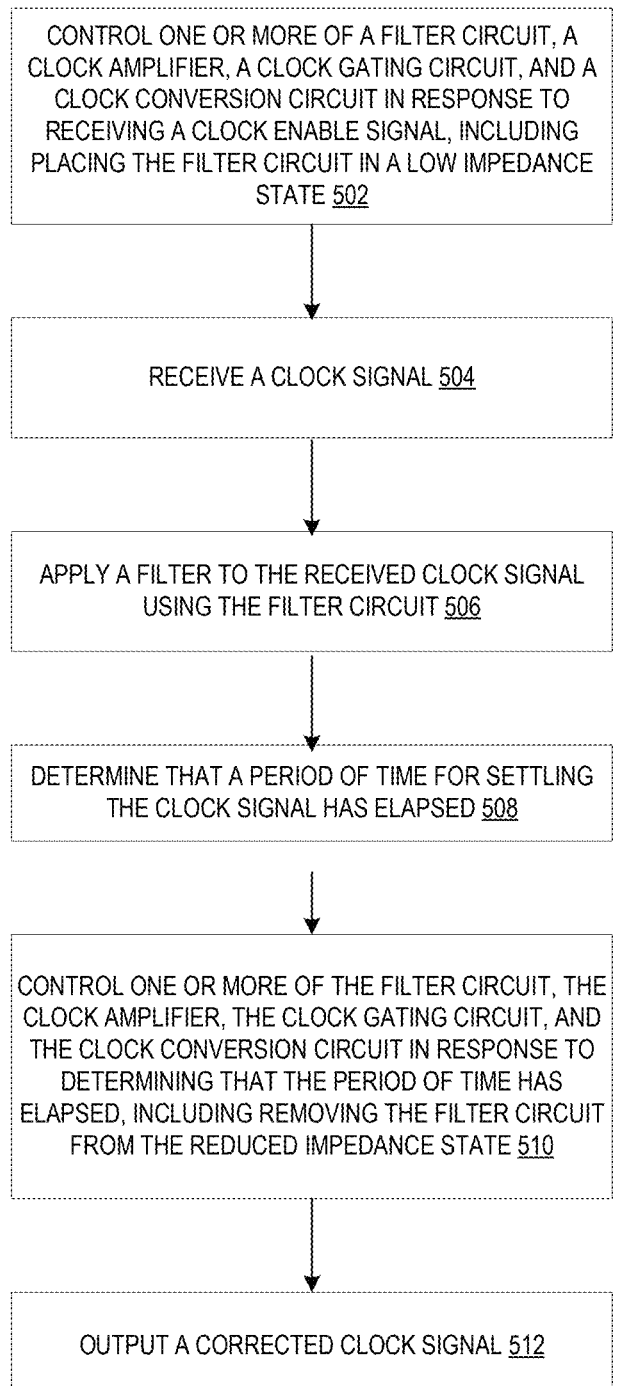

CONTROL ONE OR MORE OF A FILTER CIRCUIT, A CLOCK AMPLIFIER, A CLOCK GATING CIRCUIT, AND A CLOCK CONVERSION CIRCUIT IN RESPONSE TO RECEIVING A CLOCK ENABLE SIGNAL, INCLUDING PLACING THE FILTER CIRCUIT IN A LOW IMPEDANCE STATE 502

RECEIVE A CLOCK SIGNAL 504

APPLY A FILTER TO THE RECEIVED CLOCK SIGNAL USING THE FILTER CIRCUIT 506

DETERMINE THAT A PERIOD OF TIME FOR SETTLING THE CLOCK SIGNAL HAS ELAPSED 508

CONTROL ONE OR MORE OF THE FILTER CIRCUIT, THE CLOCK AMPLIFIER, THE CLOCK GATING CIRCUIT, AND THE CLOCK CONVERSION CIRCUIT IN RESPONSE TO DETERMINING THAT THE PERIOD OF TIME HAS ELAPSED, INCLUDING REMOVING THE FILTER CIRCUIT FROM THE REDUCED IMPEDANCE STATE 510

OUTPUT A CORRECTED CLOCK SIGNAL 512

*FIG. 5*

START 600

GENERATE AMPLIFIED CLOCK SIGNAL
BASED ON INPUT CLOCK SIGNAL — 605

FILTER DUTY CYCLE DISTORTION TO
GENERATED FILTERED CLOCK SIGNAL — 610

GENERATE CONTROL SIGNAL AFTER
PERIOD OF TIME — 615

YES

PROVIDE FILTERED CLOCK SIGNAL TO
ONE OR MORE OTHER DEVICES
BASED ON CONTROL SIGNAL — 620

END 699

CLOCK RECEIVER CIRCUIT WITH RAPID CLOCK SIGNAL SETTLING

CROSS REFERENCE TO RELATED APPLICATION

This application is a non-provisional utility application for patent entitled to a filing date and claiming the benefit of earlier-filed U.S. Provisional Patent Application No. 63/700, 647, filed Sep. 28, 2024, which is hereby incorporated herein by reference in its entirety.

BACKGROUND

Technical Field Embodiments described herein relate to integrated circuits, and more particularly, to circuits, apparatus, and methods for reducing duty cycle distortion of a clock signal.

Description of the Related Art Modern computer systems may include multiple circuits blocks (e.g., integrated circuits) designed to perform various functions. For example, such circuit blocks may include processors and/or processor cores configured to execute software or program instructions. Additionally, the circuit blocks may include memory circuits, mixed-signal or analog circuits, and the like. The integrated circuits and/or portions of the integrated circuits often use clocks and/or clock signals to operate. For example, a clock circuit (e.g., a phase-locked loop circuit, an oscillator circuit, etc.) may generate a clock signal and the clock signal may be used by an integrated circuit (or a subcircuit/portion of the integrated circuit) to control timing of operations, to drive operations/actions, etc.

Although integrated circuits may use clock circuits and/or clock signals to operate, not all integrated circuits include a clock circuit. When an integrated circuit does not include a clock circuit (or some other appropriate circuit/component for generating a clock signal), the integrated circuit may use the clock signal received from another integrated circuit (e.g., a clock source, a master clock/circuit, a primary clock/circuit, etc.). The integrated circuit may use a clock receiver circuit (e.g., a clock receiver) to receive and/or process (e.g., amplify, filter, etc.) the clock signal generated by the other integrated circuit.

When a clock receiver circuit receives an input clock signal (from a clock source) and starts to generate an output clock signal (that is used by other circuits/devices), it may take time for the output clock signal to settle/stabilize. Thus, the output clock signal may not be usable by other circuits/devices until the output clock signal has stabilized/settled.

SUMMARY OF VARIOUS EMBODIMENTS

Example circuits, apparatus and methods for reducing duty cycle distortion of a clock signal are disclosed. Such a circuit may include an amplifier configured to receive an input clock signal and generate an amplified clock signal. The circuit may also include a filter coupled to the amplifier and configured to generate a filtered clock signal based on the amplified clock signal. The circuit may also include a gating circuit coupled to the filter and configured to receive the filtered clock signal and selectively output the filter clock signal responsive to a first control signal. The circuit may also include a control circuit coupled to the gating circuit and the filter and configured to receive a timing signal, receive an enable signal, and generate the first control signal and a second control signal based on the timing signal and the enable signal, where the second control signal alters impedance of a feedback path of the filter.

Example methods for reducing duty cycle distortion of a clock signal in accordance with embodiments of the present disclosure include generating an amplified clock signal based on an input clock signal received from a clock generator circuit. Such methods may also include filtering duty cycle distortion in the amplified clock signal and generating a filtered clock signal. Such methods may also include generating a control signal after a period of time, wherein the filtered clock signal settles to a clock voltage during the period of time and providing the filtered clock signal to one or more other devices based on the control signal.

Example apparatus for reducing duty cycle distortion of a clock signal in accordance with embodiments of the present disclosure may include a clock generator circuit of a first integrated circuit device configured to generate a clock signal for a second integrated circuit device. Such an apparatus may also include a clock receiver circuit of the second integrated circuit device that receives the clock signal. The clock receiver circuit may include an amplification circuit configured to generate an amplified clock signal based on the clock signal received from the clock generator circuit, a filter circuit configured to filter duty cycle distortion in the amplified clock signal and generate a filtered clock signal, a control circuit configured to generate a first control signal after a period of time, where the filtered clock signal settles to a clock voltage during the period of time, and a gating circuit configured to provide the filtered clock signal to one or more circuits of an integrated circuit device based on the first control signal.

BRIEF DESCRIPTION OF THE DRAWINGS

The following detailed description makes reference to the accompanying drawings, which are now briefly described.

FIG. 5 illustrates a flow diagram depicting an embodiment of a method for generating a clock signal, in accordance with one or more embodiments of the present disclosure.

Figure 1:
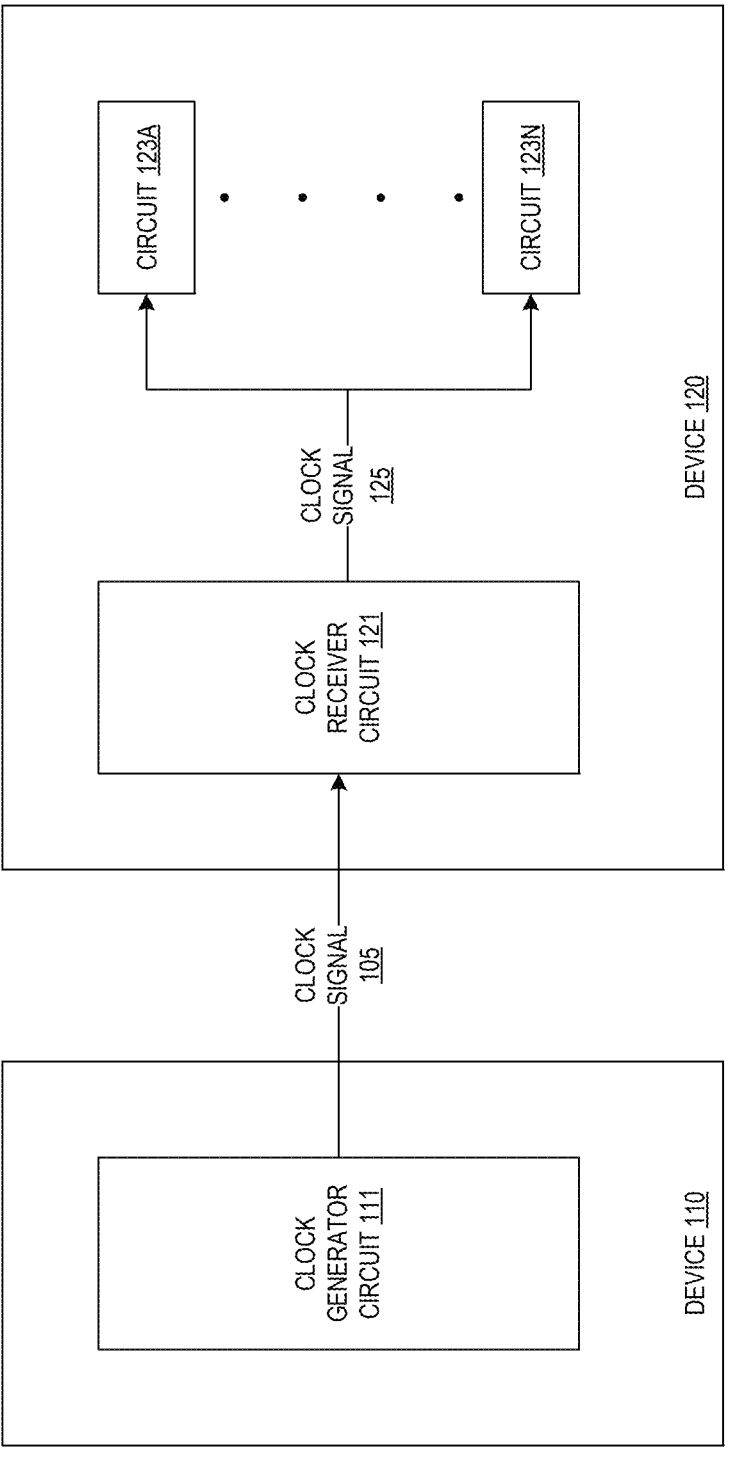
FIG. 1 illustrates a diagram of an example system, in accordance with one or more embodiments of the present disclosure.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

As discussed above, devices, integrated circuits and/or portions of the integrated circuits often use clocks and/or clock signals to operate. Although integrated circuits may use clock signals to operate, not all integrated circuits include a clock circuit. When an integrated circuit does not include a clock circuit, the integrated circuit may use a clock receiver circuit to receive and/or process (e.g., amplify, filter, etc.) the clock signal generated by the other integrated circuit (e.g., a clock source).

When a clock receiver circuit receives an input clock signal (from a clock source) and starts to generate an output clock signal, it may take time for the output clock signal to settle/stabilize. The output clock signal may not be usable by other circuits/devices until the output clock signal has stabilized/settled. This may result in delays, lag, etc., in the operation of the other circuits/devices that use the output clock signal.

In one embodiment, it may be useful to reduce the amount of time for an output clock signal to stabilize/settle. This may allow the devices/circuits that use the output clock signal to begin operating more quickly which may allow the devices/circuits to perform functions, operations, actions, etc., more quickly. This may also allow the devices/circuits that use the output clock signal to operate more efficiently (e.g., use less power) because the devices/circuits do not wait as long for the clock signal to settle/stabilize.

FIG. 1 illustrates diagram of an example system 100, in accordance with one or more embodiments of the present disclosure. The system includes devices 110 and 120. The devices 110 and 120 may each be one or more of integrated circuit devices (e.g., integrated circuit chips or dies, circuit blocks of an integrated circuit chip or die, integrated circuit packages, System-on-Chip components, etc.), logic, processing devices, memory devices, and/or other components that may be included in various computing/electronic devices.

Device 110 includes a clock generator circuit 111. The clock generator circuit 111 may be any circuit, device, component, module, etc., that may generate a clock signal, such as clock signal 105. For example, the clock generator circuit 111 may include a phase-locked loop (PLL) circuit, an oscillator, and/or another appropriate device, circuit, component, etc., for generating the clock signal 105. In some examples, the clock signal 105 is a differential clock signal. In one example, device 110 is a processor that includes the clock generator circuit. In such an example, the processor provides the clock signal other devices such as memory devices or other devices coupled to the processor via a data bus or control bus, such that providing the clock signal 105 allows for synchronization between the processor and the other devices. In another example, device 110 can be independent of a processor, where device 110 provides the clock signal to various devices through a clock distribution network, and where those various devices can include, for example, processors, memory devices, peripheral devices, and so on.

Device 120 includes a clock receiver circuit 121 and circuits 123A through 123N. The clock receiver circuit 121 may include various circuits, devices, components, modules, etc., for processing (e.g., amplifying, filtering, etc.) the clock signal 105, as discussed in more detail below. The circuits 123A through 123N may be various circuits that may be used to perform various tasks, functions, operations, etc., in the device 120. In some examples, device 120 is a device coupled to a processor. For example, device 120 can be a memory device, a network interface device, a storage interface device, a peripheral device, and so on.

As illustrated in FIG. 1, device 110 and device 120 are separate devices. For example, device 110 may be a first integrated circuit (that includes the clock generator circuit 111) and device 120 may be a separate/different integrated circuit. In another example, device 110 may be a first circuit block (that includes the clock generator circuit 111) and device 120 may be a second/separate circuit block, and both the device 110 and device 120 may be located on the same integrated circuit. One or more connections, traces, lines, etc., may be used to communicate signals and/or data between the device 110 and device 120. For example, one or more signal lines or traces may be used to provide the clock signal 105 from device 110 to device 120.

Also as illustrated in FIG. 1, device 120 does not include a clock generator circuit. However, circuits 123A and 123N may use a clock signal to operate properly. For example, circuit 123A may use a clock signal to control timing of operations/functions, to drive sub-circuits in the circuit 123A, etc. The device 120 may use the clock receiver circuit 121 to provide clock signal 125 to the circuits 123A to 123N.

In one embodiment, the clock signal 105 generated by the clock generator circuit 111 may not be usable by the circuits 123A to 123N. For example, the clock signal 105 may weaken or experience loss as the clock signal 105 is transmitted from device 110 to device 120. The clock receiver circuit 121 may process (e.g., filter, amplify, convert, transform, etc.) the clock signals 105 (received from device 110 and/or clock generator circuit 111) to generate the clock signal 125, as discussed in more detail below.

When the clock receiver circuit 121 processes the clock signal 105 to generate the clock signal 125, it may take time for the clock signal 125 to settle. For example, when the clock signal 125 is stable or settled, the voltage of the clock signal 125 oscillates between a high voltage and a low voltage around a particular voltage (e.g., a clock voltage, a center voltage, etc.). In some embodiments, the ideal clock signal is a periodic electronic digital signal with a square wave pattern, with a clearly detectable rising edge and clearly detectable falling edge as the voltage of the signal oscillates between a relative high voltage and a relative low voltage. However, when the clock receiver circuit 121 is initialized, turned on, enabled, etc., voltage of the clock signal 125 may exceed the relative high voltage and/or may decrease below the relative low voltage. In addition, the center/middle of the oscillation may not match the clock voltage. After a period of time, the voltage of the clock signal may settle or stabilize (e.g., may remain between the high voltage and low voltage, and may be centered around the clock voltage).

In one embodiment, the clock receiver circuit 121 may be turned on and off multiple times. For example, the device 120 may frequently enter a lower power mode or sleep mode. The clock receiver circuit 121 may be turned off when the device 120 enters a low/lower power mode and may be turned on when the device 120 enters a high/higher power mode. The amount of time for the clock signal 125 to settle may increase the amount of time for the device 120 (and/or circuits 123A to 123N) to begin operations. For example, the device 120 and/or circuits 123A to 123N may not be able to begin operation until the clock signal 125 stabilizes/settles.

The embodiments, implementations, and/or examples described herein provide a clock receiver circuit 121 that may allow the clock signal 125 to settle more quickly. The resistance and/or impedance of one or more portions of the clock receiver circuit 121 may be reduced (e.g., temporarily reduced, reduced for a period of time) to allow clock signal 125 to settle/stabilize more quickly, as discussed in more detail below. This may allow the device 120 and/or circuits 123A through 123N to begin/start operating more quickly. This may also allow the device 120 and/or circuits 123A through 123N to operate more efficiently (e.g., to use less power).

Figure 2:
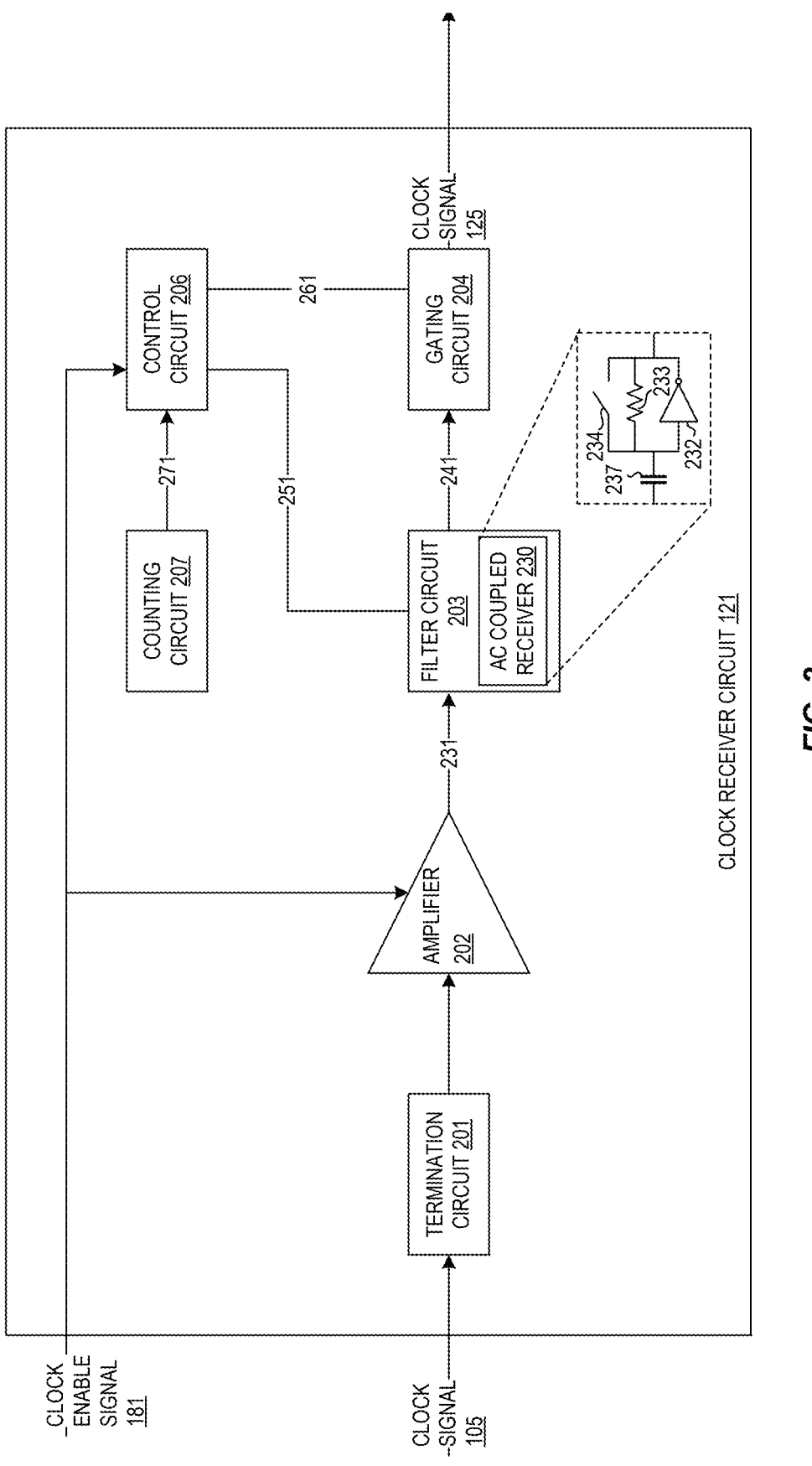
FIG. 2 illustrates a diagram of an example clock receiver circuit, in accordance with one or more embodiments of the present disclosure.

FIG. 2 illustrates a diagram of an example clock receiver circuit 121, in accordance with one or more embodiments of the present disclosure. As illustrated in FIG. 2, the clock receiver circuit includes a termination circuit 201, an amplifier 202, a filter circuit 203, a gating circuit 204, and a control circuit 206. As discussed above, the clock receiver circuit 121 processes clock signal 105 (e.g., filter, amplify, etc.) and generates clock signal 125. In some examples, the clock receiver circuit 121 is turned on and off by a clock enable signal 181.

In some examples, clock signal 105 is a differential clock signal. A differential clock signal is often used to minimize noise and signal degradation. Unlike a traditional single-ended clock signal, which relies on a single physical clock signal (e.g., a single wire carrying the clock pulse), a differential clock signal uses two complementary signals transmitted across two wires or traces. The component clock signals of a differential clock signal are complementary, in that the voltage of one signal is the inverse of the other. The two clock signals oscillate around a center clock voltage. The receiving circuit interprets the differential clock signal based on the voltage difference between the component clock signals, hence the term 'differential.' The common noise experienced by both component signals will cancel out when the differential voltage is used.

Figure 7A:
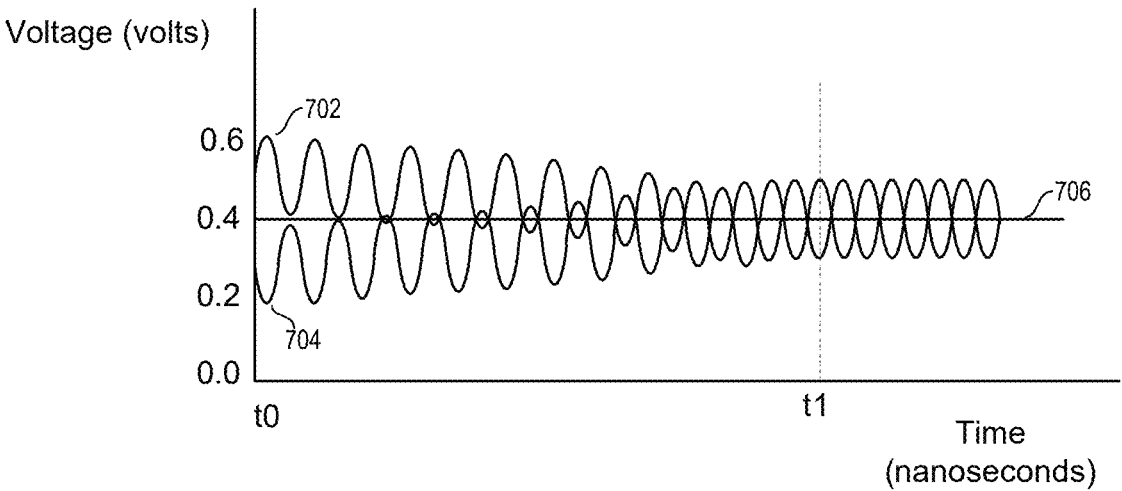
FIG. 7A illustrates an example waveform of a differential clock signal in a conventional clock receiver circuit.

When the component signals of a differential clock signal are received and amplified by the receiving circuit, distortions in the amplified signal may cause the component clock signals to oscillate around different center voltages. Filtering is applied to the amplified clock signal so that the component clock signals converge on a common center voltage, common amplitude, and common duty cycle, which is also referred to as 'settling' in the context of a differential clock signal. For example, FIG. 7A illustrates component clock signals 702, 704 of a differential clock signal, where the differential clock signal is settled at time t1 around center voltage 706. As can be seen in FIG. 7A, the amount of time from time t0 to time t1 is the amount of time required for the differential clock signal to settle. Where the differential clock signal is not provided to other components until it has settled, reducing the settling time can allow devices waiting for the clock signal to begin operation more quickly. This can lead to substantial time savings and power savings, particularly in the case where components are repeatedly turned off and on due to a power saving mode or sleep mode of the device. That is, each time the device is turned on, the clock receiver circuit must again wait for the differential clock signal to settle before providing the clock signal to a clock distribution network.

The clock signal 105 (e.g., from clock generator circuit 111) is received by the termination circuit 201. In various examples, the termination circuit 201 can be a circuit, device, component, etc., that provides electrostatic discharge protection for the clock receiver circuit 121. In various examples, the termination circuit 201 can be a circuit, device, component, etc., that terminates the clock signal 105 by, for example, preventing reflections of the clock signal 105 from going back to the clock generator circuit 111.

The termination circuit 201 provides the clock signal 105 to the amplifier 202, which generates an amplified clock signal 231. In some examples, the amplifier 202 can be any circuit, device, component, etc., that amplifies the clock signal 105 to generate the amplified clock signal 231. For example, the amplifier 202 may increase the amplitude, voltage or voltage swing, etc., of the clock signal 105 to generate the amplified clock signal 231. The amplifier 202 may also be referred to as a preamplifier. In some examples, the amplifier may also provide common mode rejection for the clock signal 105. To conserve power, the amplifier 202 is not turned on until it receives a clock enable signal 181.

The amplified clock signal 231 (generated by the amplifier 202) is received by the filter circuit 203. In some examples, the filter circuit is one or more circuits, devices, components, etc., that filters the amplified clock signal 231 to reduce and/or remove duty cycle distortion in the amplified clock signal 231 (e.g., reduces/removes distortions in the frequency of the amplified clock signal 231). The filter circuit 203 may include a capacitor, inverter, and a feedback resistor, as discussed in more detail below. The filter circuit 203 generates a filtered clock signal 241 (e.g., a filtered version of amplified clock signal 231). After a settling time has elapsed, the filtered clock signal 241 is a settled clock signal (e.g., a clock signal with a 50% duty cycle).

In one embodiment, the gating circuit 204 receives the filtered clock signal and is utilized to prevent the filtered clock signal 241 to be output from the clock receiver circuit 121 until the filtered clock signal 241 has settled. For example, the gating circuit may output the filtered clock signal 241 as clock signal 125 to other circuits (e.g., to circuits 123A through 123N illustrated in FIG. 1). The gating circuit 204 may output the clock signal 125 (e.g., allow the filtered clock signal 241 to go to an output) or may prevent/block clock signal 125 from being output based on a control signal 261 received from the control circuit 206, as discussed in more detail below.

The control circuit 206 generates control signals for controlling the filter circuit 203, the gating circuit 204, and other elements, as will be described in more detail below. In some examples, the control circuit 206 generates one or more control signals based on a clock enable signal 181 and a timing signal 271. For example, the control circuit 206 can operate the gating circuit 204 based on the clock enable signal 181 and the timing signal 271. The control circuit 206 may use the timing signal 271 to calculate, measure, determine, etc., a period/amount of time for determining when the filtered clock signal 241 has settled. For example, the timing signal 271 can be received from a counting circuit 207 that generates the timing signal 271. Although the counting circuit 207 is shown in FIG. 2 as part of the clock receiving circuit 121, it will be appreciated that the counting circuit 207 can be external to the clock receiving circuit. An example implementation of the counting circuit 207 is described in more detail below. Once the settling time has elapsed, the control circuit 206 uses control signal 261 to control the gating circuit 204 to output the filtered clock signal 241 as clock signal 125. Also, the control circuit 206 may generate control signal 251 to control the operation of filter circuit 203, as discussed in more detail below. When the clock receiver circuit 121 is disabled by the clock enable signal 181, the amplifier 202 is turned off to conserve power and the gating circuit 204 is controlled to stop generating clock signal 125 (e.g., by not emitting a signal that toggles between states). In some examples, the clock enable signal 181 is received from the device that provides the clock signal 105. For example, the clock enable signal 181 can be provided by device 110 in FIG. 1.

In some examples, the filter circuit 203 is controlled by a control signal 251 received from the control circuit 206. For example, the filter circuit 203 may connect and disconnect a feedback resistor in a filter circuit based on the control signal 251 to control the signal impedance within the filter circuit 203, as discussed in more detail below. In some examples, the filter circuit 203 includes an alternating current (AC) coupled receiver 230 that includes a capacitor 237 connected in series with an inverter 232 and at least one feedback resistor 233 that is coupled in parallel with the inverter 232. The output of the AC coupled receiver 230 is supplied to one or more buffers to generate the filtered clock signal 241. While AC coupled receivers provide a low-power implementation for clock signal correction, they are often associated with a long settling time. The resistor-capacitor (RC) time constant between the feedback resistor 233 and the capacitor 237 determines how long it takes for the clock signal to settle. Thus, reducing the impedance in the filter circuit 203 can lead to a shorter settling time of the filtered clock signal 241. However, the feedback resistor 233 is necessary for normal operation of the AC coupled receiver 230.

In a particular embodiment, the AC coupled receiver 230 includes a switch 234 coupled in parallel with the feedback resistor 233. When the clock enable signal 181 is received, the control circuit 206 controls the switch 234 via control signal 251 to close the switch 234. Closing the switch 234 creates a low impedance path around the feedback resistor 233, thus facilitating faster settling. After the settling time has elapsed, the control circuit 206 controls switch 234 to open the switch, thus adding the impedance of feedback resistor 233. The reduced impedance at the outset allows the clock signal to settle more quickly, while the resistor 233 is added back to the circuit for normal operation. It will be appreciated that filter circuit 203 may include additional resistors in parallel to the inverter 232, which may or may not be coupled in parallel to respective switches, for additional impedance control. It will also be appreciated that the filter circuit includes other elements such as buffers for filtering and correcting the clock signal 105.

Figure 7B:
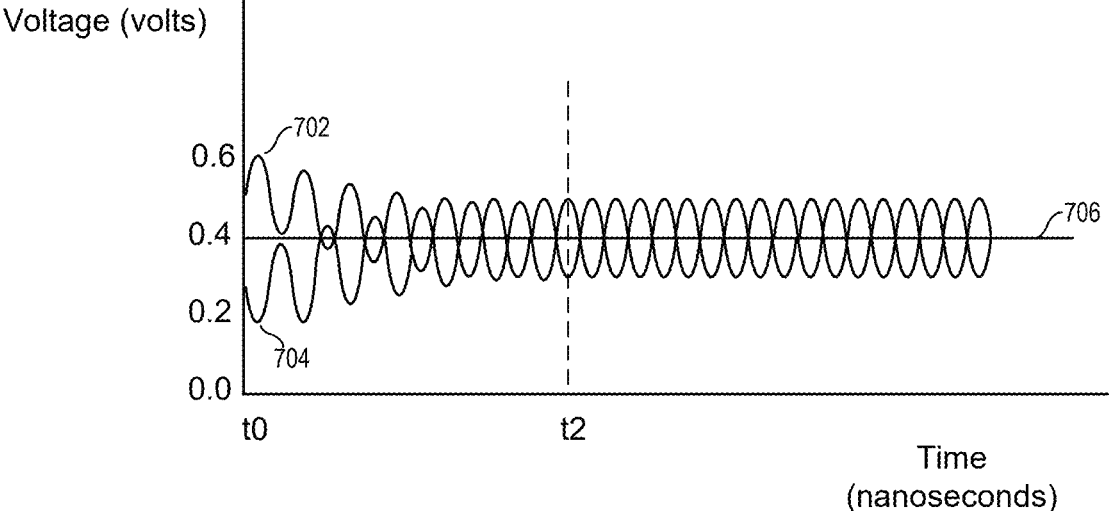
FIG. 7B illustrates an example waveform of a differential clock signal using a clock receiver circuit in accordance with one or more embodiments of the present disclosure.

For further explanation, FIG. 7B illustrates component clock signals 702, 704 of a differential clock signal as also shown in FIG. 7A. In FIG. 7B, the differential clock signal is settled at time t2 using the clock receiver circuit 121 in accordance with the present disclosure. As can be seen from FIGS. 7A and 7B, the amount of time from time t0 to time t2 in FIG. 7B is smaller than the amount of time from t0 to t1 in FIG. 7A. Thus, the clock receiver circuit 121 achieves a faster settling time than conventional clock receiver circuits.

Figures 3A, 3B:
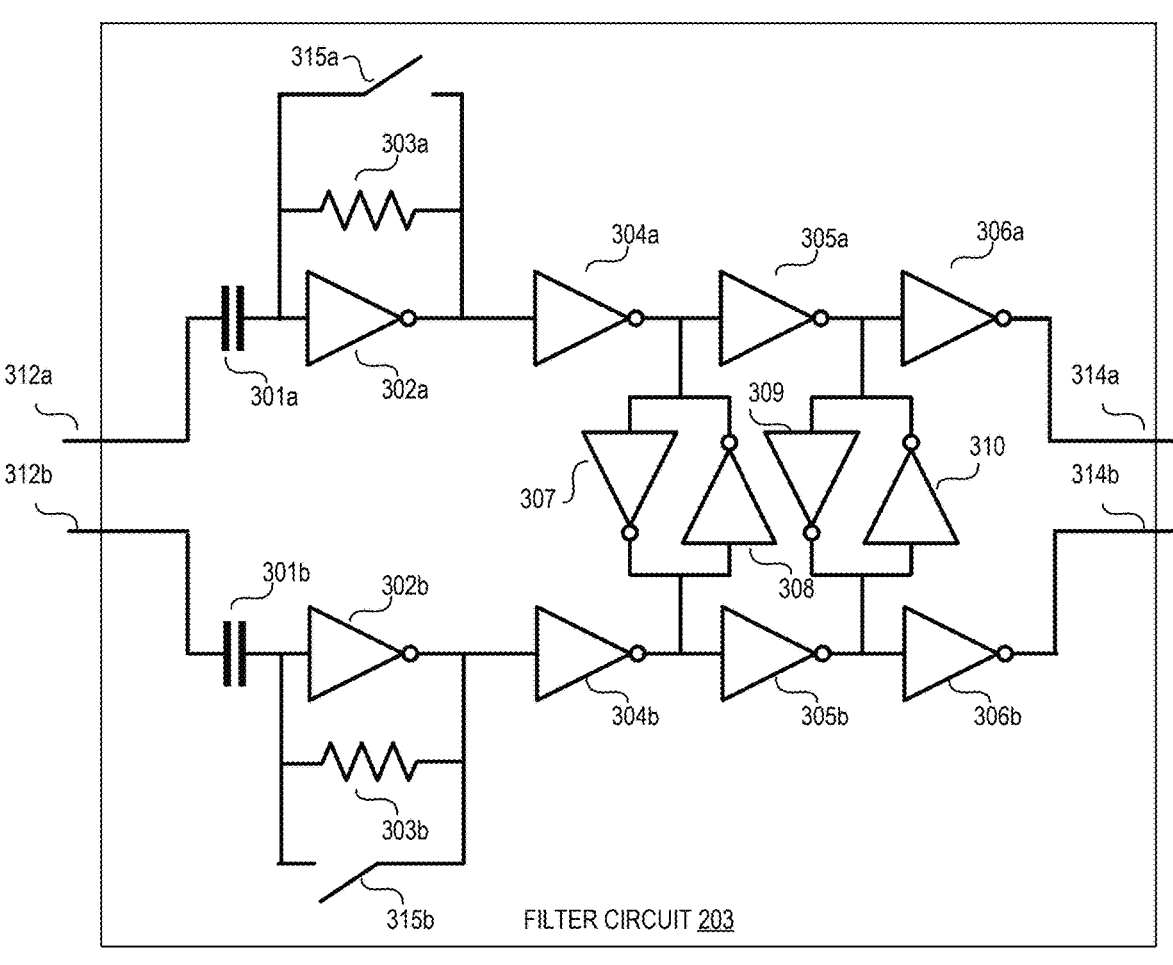
FIG. 3A illustrates a diagram of an example filter circuit, in accordance with one or more embodiments of the present disclosure.
FIG. 3B illustrates a diagram of another example filter circuit, in accordance with one or more embodiments of the present disclosure.

FIG. 3A illustrates a diagram of an example of filter circuit 203, in accordance with one or more embodiments of the present disclosure. The example filter circuit 203 may receive an amplified clock signal and filter signal to reduce and/or remove duty cycle distortion in the amplified clock signal. The example filter circuit 203 of FIG. 3A includes capacitors 301a and 301b, inverters 302a, 304a, 305a, and 306a, inverters 302b, 304b, 305b, and 306b, inverters 307, 308, 309, and 310, and resistors 303a and 303b. Inverter 302a and resistor 303a are coupled in parallel with a switch 315a, such as the switch 234 in FIG. 2. Inverter 302b and resistor 303b are coupled in parallel with a switch 315b, such as the switch 234 in FIG. 2. Inverters 304a, 305a, and 306a, and inverters 304b, 305b, and 306b, as well as inverters 307, 308, 309, 310, form a buffer network. The filter circuit receives clock signal 312a and complementary clock signal 312b from an amplifier circuit such as amplifier 202 of FIG. 2. Clock signal 312a and complementary clock signal 312b are transmitted through the inverters, capacitors and resistors to output filtered clock signal 314a and filtered complementary clock signal 314b. It is noted that this is but one of a many number of possible example filter circuits that may be used in clock receiver circuits such as those disclosed herein.

FIG. 3B illustrates a diagram of another example an AC coupled receiver 300 for the filter circuit 203, in accordance with one or more embodiments of the present disclosure. Like the AC coupled receiver 230 in FIG. 2, the AC coupled receiver 300 in FIG. 3B includes a capacitor 331 in series an inverter 332 and a feedback resistor 333 coupled in parallel with the inverter 332. The AC coupled receiver 300 also includes a series-connected switch 334 and a switched feedback resistor 335 coupled in parallel with inverter 332. For example, the switched feedback resistor 335 may have a lower resistance than the feedback resistor 333, thus providing a low impedance path through the switched resistor 335.

As discussed above, the filter circuit 203 may operate based on a control signal 251 received from the control circuit 206 (illustrated in FIG. 2). In particular, control signal 251 may be used to control the switch 334. For example, the switch may be turned on and/or turned off based on the control signal 251. When the switch 334 is turned on, the switched feedback resistor 335 is coupled to the capacitor 331 and/or the inverter 332. When the switch 334 is turned off, the switched feedback resistor 335 is disconnected from the capacitor 331 and/or the inverter 332.

As discussed above, the filter circuit 203 may generate a filtered clock signal (e.g., a filtered amplified clock signal) and may provide the filtered clock signal to the gating circuit 204. In an example using the AC coupled receiver of FIG. 3B, when the clock receiver circuit 121 and/or device 120 is turned on, initializes, powers up, leaves low/lower power mode, etc., the control circuit 206 may use control signal 251 to turn on the switch 334 and couple the switched feedback resistor 335 to the inverter 332. Coupling the switched feedback resistor 335 to the inverter 332 reduces the impedance and/or resistance of the filter circuit 203. Reducing the impedance and/or resistance of the filter circuit 203 allows the filtered clock signal 241 to settle more quickly. This allows the clock receiver circuit 121 to output clock signal 125 more quickly and allows the devices and/or circuits 123A through 123N to begin operation more quickly. Although one switched feedback resistor 335 and one switch 334 are illustrated in FIG. 3B, additional feedback resistors and switches may be used in other embodiments. For example, another example feedback circuit may include multiple resistors, each resistor coupled to a respective switch in series, similar to switched resistor 335 and switch 334. In some embodiments, the switched feedback resistor 335 (and any other feedback resistors in examples where multiple feedback resistors are used) may have a lower resistance than the resistor 333.

In one embodiment, after a period of time (determined, calculated, etc., by the control circuit 206) during which the filtered clock signal 241 settles, the control circuit 206 may use control signal 251 to turn off the switch and disconnect the switched feedback resistor 335 from the capacitor 331 and/or the inverter 332. This may allow the filter circuit 203 to resume normal operation and continue to generate filtered clock signal 241.

Figure 4:
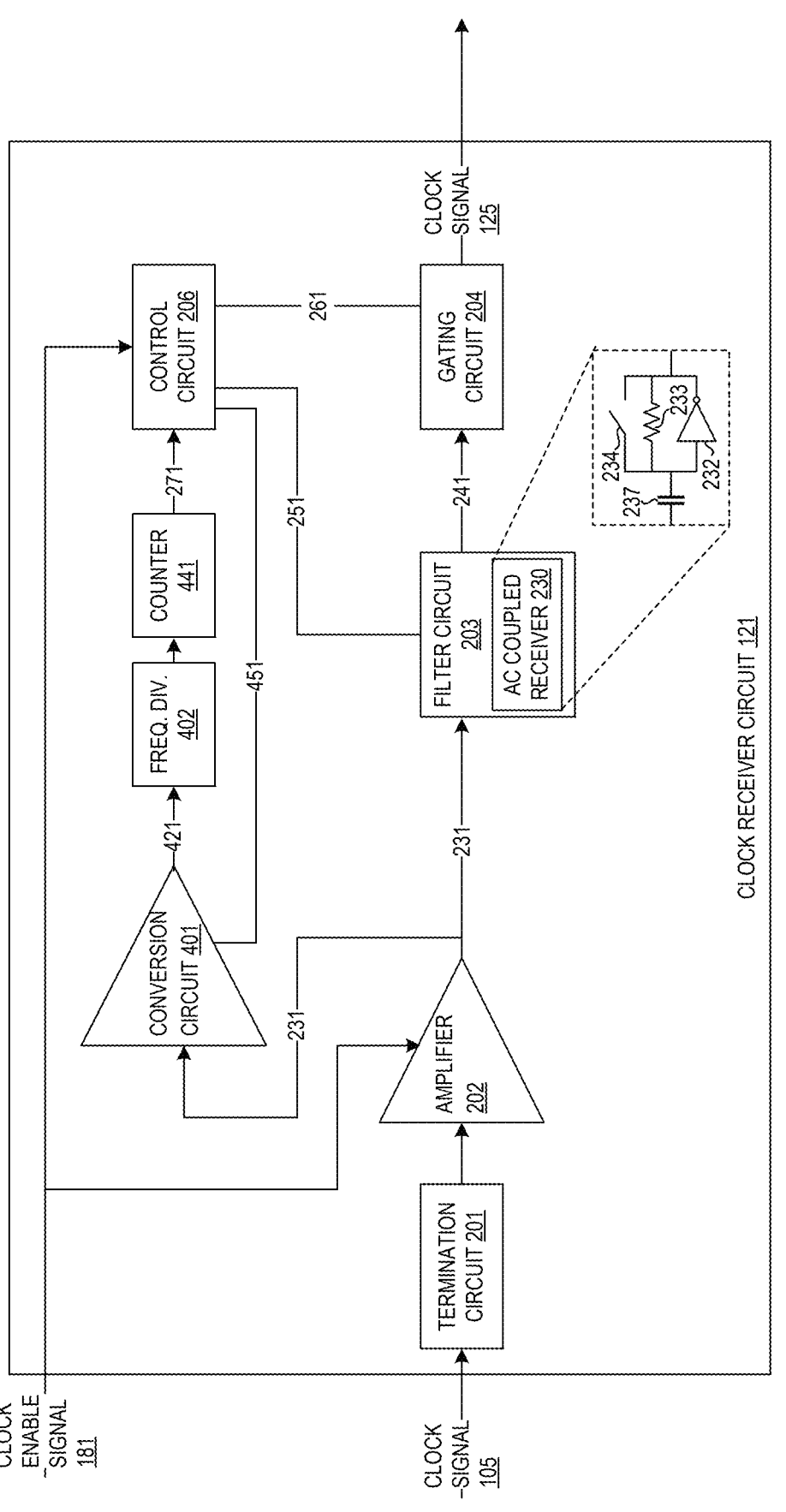
FIG. 4 illustrates a diagram of an example clock receiver circuit, in accordance with one or more embodiments of the present disclosure.

FIG. 4 illustrates an example implementation of the clock receiver circuit 121 in accordance with one or more embodiments of the present disclosure. In the implementation depicted in FIG. 4, the clock receiver circuit 121 includes a clock conversion circuit 401. The clock conversion circuit 401 receives the amplified clock signal 231 from the amplifier 202 and converts the amplified clock signal 231 from a current mode logic (CML) signal into a single-ended clock signal complementary metal oxide semiconductor (CMOS) signal. Converting the CML/amplified clock signal 231 to a CMOS clock signal 421 generates a better-quality clock signal that can be used to count rising edges of the clock signal 105, though the CMOS clock signal 421 may still suffer from duty cycle distortions. To reduce the effect of the duty cycle distortions, in some examples, the CMOS clock signal 421 is routed through a frequency divider 402. The rising edges of the frequency divided signal are used by a counter 441 to determine when a period of time (e.g., the settling time) has elapsed since the clock receiver circuit 121 began receiving the clock signal 105.

In one various examples, counter 441 may be any circuit, device, component, etc., that may count the number of clocks cycles in the CMOS clock signal 421. For example, once the counter 441 starts receiving the CMOS clock signal 421 the counter 441 may detect rising edges in the CMOS clock signal 421. Each rising edge may represent and/or indicate a clock cycle. The counter 441 may update a tracking value each time a rising edge is detected in the CMOS clock signal 421 (e.g., may track the number of clock cycles in the CMOS clock signal 421). The counter 441 may provide the tracking value as the timing signal 271 to the control circuit 206 each time the tracking value is incremented/decremented, or the counter 441 may store the tracking value in a memory, a register, etc., that is accessible to the control circuit 206.

In one embodiment, the control circuit 206 determines whether the tracking value matches a threshold or target number. The amount or period of time for the tracking value to match the threshold/target number corresponds to the amount of time for the filtered clock signal 241 to settle. For example, the threshold/target number may be selected, calculated, determined, etc., to provide sufficient time for the filtered clock signal 241 to settle (e.g., to provide sufficient clock cycles for the filtered clock signal to settle). The threshold/target number may be configured, set, etc., during initialization, installation, setup, etc., of the clock receiver circuit 121 and/or device 120.

Once the tracking value reaches the threshold/target number (e.g., if the counter is counting down from a configured value, that target number would be zero), the control circuit

206 utilizes control signal 251 to operate switch 234 in the filter circuit 203 (e.g., to close the switch 234) for normal operation. The control circuit 206 also utilizes control signal 261 to control gating circuit 204 to transition to an open state and propagate filtered clock signal 241 as clock signal 125. Thus, devices and/or circuits 123A through 123N do not receive a clock signal until the clock signal has settled, which can conserve power in those devices. The control circuit 206 also utilizes a control signal 451 to turn off conversion circuit 401 because the tracking value is no longer needed. Thus, the power-consuming CML to CMOS logic of the conversion circuit 401 is only utilized to identify when the settling time has elapsed. The conversion circuit 401, frequency divider 402, and counter 441 are not used after settling, thus conserving power by limiting the utilization of the CML to CMOS logic.

For further explanation, FIG. 5 sets forth a flow chart illustrating an example operation of the clock receiver circuit 121 described in FIGS. 1-4 in accordance with at least one embodiment of the present disclosure. The example operation includes controlling 502 one or more of a filter circuit, a clock amplifier, a clock gating circuit, and a clock conversion circuit in response to receiving a clock enable signal. In some examples, the clock receiver circuit 121, in response to the clock enable signal 181, places the clock gating circuit 204 in a closed state in which clock signal 125 is not generated. In some examples, the clock receiver circuit, in response to the clock enable signal 181, turns on an amplifier 202 to amplify the received clock signal. In some examples, the clock receiver circuit 121, in response to the clock enable signal 181, places the filter circuit 203 in a reduced impedance state. For example, the clock receiver circuit 121 closes a switch 234, 315a, 315b, 334 to reduce the impedance of an AC coupled receiver 230, 300. In some examples, the clock receiver circuit, in response to the clock enable signal 181, turns on a clock conversion circuit 401. For example, the clock conversion circuit 401 converts a CML signal to a CMOS signal. A counter then counts the rising edges of the CMOS clock signal to generate a tracking value, e.g., by decrementing a preconfigured set value of the counter.

The example operation of the clock receiver circuit 121 in FIG. 5 also includes receiving 504 a clock signal. In some examples, the received clock signal 105 is received at approximately the same time that the clock enable signal 181 is received. In some examples, the clock signal 105 is a differential clock signal.

The example operation of the clock receiver circuit 121 in FIG. 5 also includes applying 506 a filter to the received clock signal using the filter circuit. In some examples, the clock receiver circuit 121 filters an amplified clock signal 231 (e.g., the amplified signal of the received clock signal 105) to correct one or more of the duty cycle, amplitude, and center voltage of the amplified clock signal 231. For example, the clock receiver circuit 121 corrects the amplified clock signal 231 using an AC coupled receiver 230 and one or more buffers of the filter circuit 203.

The example operation of the clock receiver circuit 121 in FIG. 5 also includes determining 508 that a period of time for settling the clock signal has elapsed. In some examples, the clock receiver circuit 121 determines that the period of time has elapsed based on the tracking value from the counter 441. For example, when the tracking value equals zero, the clock receiver circuit 121 determines that the period of time has elapsed.

The example operation of the clock receiver circuit 121 also includes controlling 510 one or more of the filter circuit, the clock amplifier, the clock gating circuit, and the clock conversion circuit in response to determining that the period of time has elapsed, including removing the filter circuit from the reduced impedance state. In some examples, the clock receiver circuit 121 controls the filter circuit 203 to open switch 234, 315a, 315b, 334 to increase the impedance of the AC coupled receiver 230, 300 to a value for normal operation. In some examples, the clock receiver circuit 121 places the clock gating circuit 204 in an open state in which the filtered clock signal 241 is output as clock signal 125. In some examples, the clock receiver circuit 121 turns off the clock conversion circuit 401 to conserve power, as the clock conversion circuit 401 and counter 441 are no longer needed.

The example operation of the clock receiver circuit 121 also includes outputting 512 a corrected clock signal. In some examples, the clock receiver circuit 121 outputs the filtered clock signal 241 as clock signal 125 to a clock distribution network of a device 110.

In view of the foregoing, it will be appreciated that a clock receiver circuit in accordance with the present disclosure increases the responsiveness of a device to a received clock signal by a reducing a settling time of the received clock signal, which also has the effect in decreasing power consumption of clocked circuits in the device. It will also be appreciated that a clock receiver circuit in accordance with the present disclosure decreases power consumption of clocked circuits in the device by restricting the output of a clock signal until the clock signal has settled. It will also be appreciated that a clock receiver circuit in accordance with the present disclosure mitigates a power consumption of circuits in the clock receiver circuit that are used to determine when the settling time has elapsed by turning of those circuits once the settling time has elapsed.

Structures such as those shown in FIGS. 1-4 for generating a clock signal may be referred to using functional language. In some embodiments, these structures may be described as including "means for generating an amplified clock signal based on an input clock signal received from a clock generator circuit," "means for filtering duty cycle distortion in the amplified clock signal and generating a filtered clock signal," "means for generating a control signal after a period of time," "means for providing the filtered clock signal to one or more other devices based on the control signal," "means for generating an internal clock signal based on the amplified clock signal," "means for converting the amplified clock signal to a singled-ended clock signal," "means for counting clock cycles of the input clock signal."

The corresponding structure for "means for generating an amplified clock signal based on an input clock signal received from a clock generator circuit," are clock receiver circuit 121 and/or amplifier 202 as well as equivalents of these circuits. The corresponding structure for "means for filtering duty cycle distortion in the amplified clock signal and generating a filtered clock signal," are clock receiver circuit 121 and/or filter circuit 203 as well as equivalents of these circuits. The corresponding structure for "means for generating a control signal after a period of time" are clock receiver circuit 121 and/or control circuit 206 as well as equivalents of these circuits. The corresponding structure for "means for providing the filtered clock signal to one or more other devices based on the control signal" are clock receiver circuit 121 and/or gating circuit 204 as well as equivalents of this circuit. The corresponding structure for "means for generating an internal clock signal based on the amplified clock signal" are clock receiver circuit 121 and/or clock conversion circuit 401 as well as equivalents of these circuits. The corresponding structure for "means for converting the amplified clock signal to a single-ended clock signal" are clock receiver circuit 121 and/or clock conversion circuit 401 as well as equivalents of these circuits. The corresponding structure for "means for counting clock cycles of the input clock signal" are clock receiver circuit 121, clock conversion circuit 401, counter 441 and/or control circuit 206 as well as equivalents of this circuit.

Figure 6:
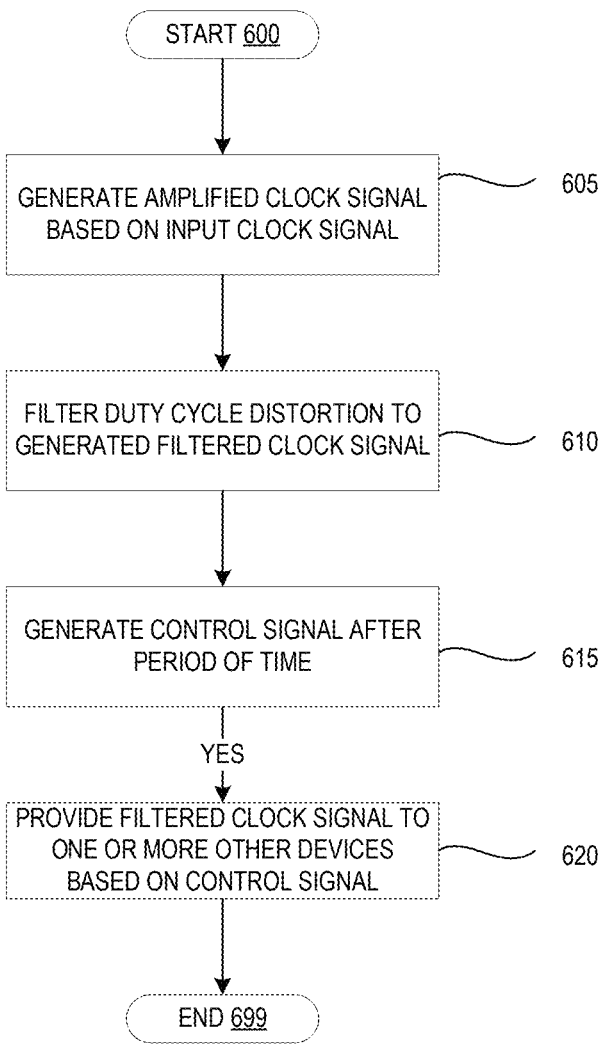
FIG. 6 illustrates a flow diagram depicting an embodiment of a method for generating a clock signal, in accordance with one or more embodiments of the present disclosure.

FIG. 6 illustrates a flow diagram depicting an embodiment of a method for generating a clock signal, in accordance with one or more embodiments of the present disclosure. The method, which may be applied to the examples illustrated in FIGS. 1 to 4 and variations thereof, starts at the block 600 and ends at block 699.

The method includes generating an amplified clock signal at block 605. For example, an input clock signal may be amplified to generate an amplified clock signal. The amplitude of the input clock signal may be increased to generate the amplified clock signal. Common mode rejection may also be performed when generating the amplified clock signal.

At block 610, the method includes filtering duty cycle distortion in the amplified clock signal to generate a filtered clock signal. In one embodiment, the resistance/impedance of the portion of the clock receiver circuit may also be reduced (e.g., by coupling a feedback resistor to the portion of the clock receiver circuit) at block 610. As discussed above, this may allow the filtered clock signal to settle more quickly.

At block 615, the method includes generating a control signal after a period of time. The filtered clock signal may settle/stabilize during the period of time. To determine, measure, or wait for the period of time, an internal clock signal may be used. A counter may count the number of clock cycles in the internal clock signal. When the number of clock cycles matches a target number, the control signal may be generated.

At block 620, the filtered clock signal may be output as an output clock signal based on the control signal. For example, when the control signal is received, the filtered clock signal may be output as the output clock signal. The output clock signal may be provided to one or more other circuits/devices that use the output clock signal. For example, a gating circuit may receive the control signal (generated at block 615). The gating circuit may allow the filtered clock signal to go to an output (e.g., to be output) when the control signal is received.

Figure 8:
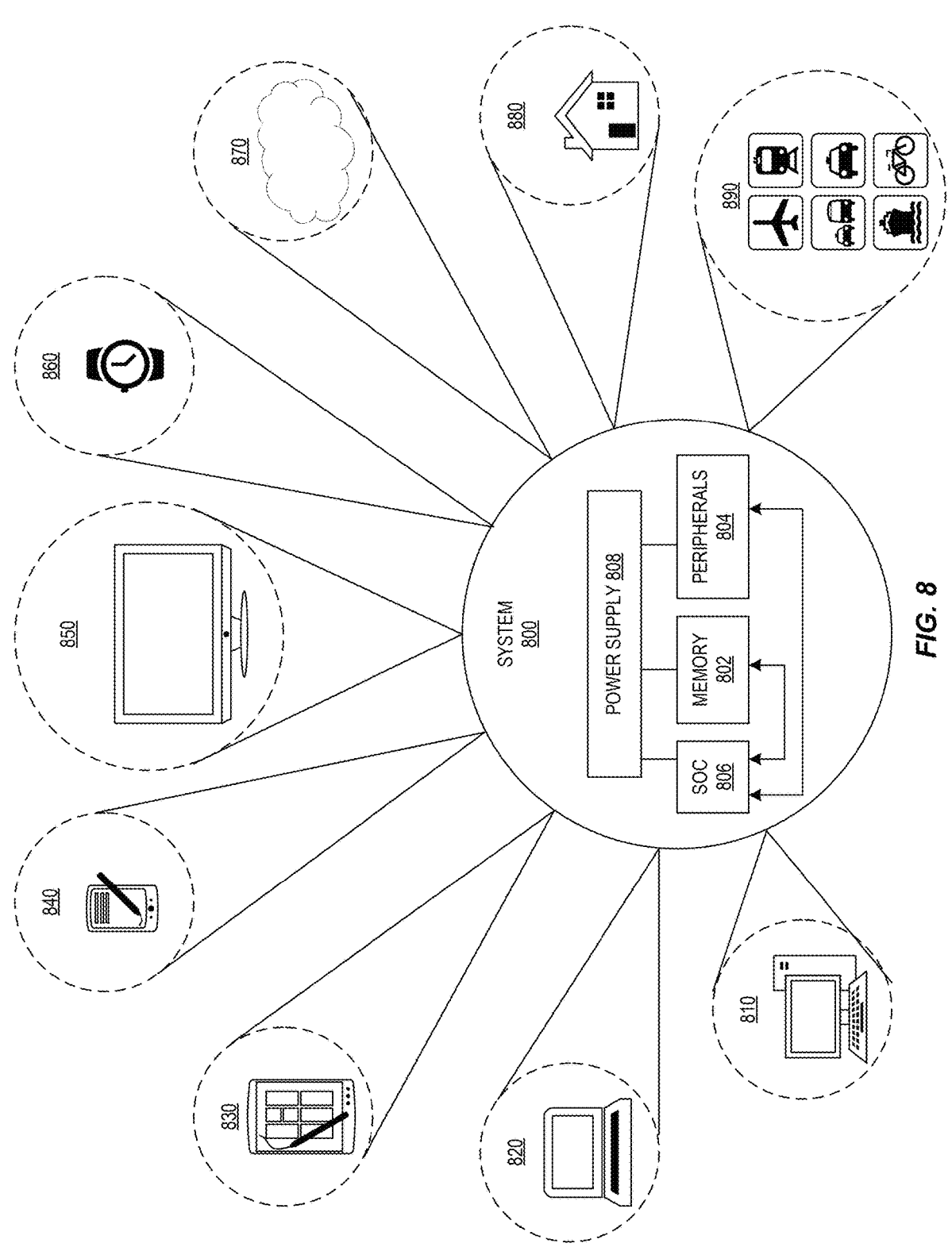
FIG. 8 illustrates a block diagram of an example system, in accordance with one or more embodiments of the present disclosure.

FIG. 8 illustrates a block diagram of an example system 800, in accordance with one or more embodiments of the present disclosure. The system 800 may incorporate and/or otherwise utilize the circuits, devices, components, methods, functions, and/or mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808. The system 800 may use plates (with regions and/or vias) that are coupled to various components (e.g., coupled to SoC 806).

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home 880 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation 890. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to." When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A circuit for reducing duty cycle distortion of the clock signal, the circuit comprising:
   an amplifier configured to receive the input clock signal and generate an amplified clock signal;
   a filter circuit coupled to the amplifier and configured to generate a filtered clock signal based on the amplified clock signal,
   a gating circuit coupled to the filter circuit and configured to receive the filtered clock signal and selectively output the filter clock signal responsive to a first control signal;
   a control circuit coupled to the gating circuit and the filter circuit and configured to receive a timing signal, receive an enable signal, and generate the first control signal and a second control signal based on the timing signal and the enable signal, wherein the second control signal alters impedance of a feedback path of the filter circuit.

2. The circuit of claim 1, wherein the filter circuit comprises a capacitor coupled to an input of an inverter, a feedback resistor, and a switch.

3. The circuit of claim 2, wherein the feedback resistor and the switch are coupled in parallel and the second control signal is configured to close the switch, thereby reducing the impedance in the feedback path of the filter circuit.

4. The circuit of claim 2, wherein the feedback resistor and the switch are coupled in parallel and the second control signal is configured to open the switch, thereby increasing the impedance in the feedback path of the filter circuit.

5. The circuit of claim 1, further comprising:
   a converter that receives the amplified clock signal and converts the amplified clock signal to a CMOS (complimentary metal oxide semiconductor) clock signal; and
   a counter circuit that receives the CMOS clock signal and is configured to count a number of cycles of the CMOS clock signal and generate the timing signal.

6. The circuit of claim 5, further comprising a frequency divider that alters frequency of the CMOS clock signal before the counter circuit receives the CMOS clock signal.

7. The circuit of claim 5, wherein the CMOS clock signal is a single-ended signal.

8. The circuit of claim 7, wherein the input clock signal and the filtered clock signal are differential clock signals.

9. The circuit of claim 1, wherein the input clock signal is received from an off-chip clock generator circuit.

10. The circuit of claim 1, wherein the amplified clock signal comprises a pair of complementary signals and the filter circuit further comprises:
   a first path receiving a first of the pair of complementary signals and a second path receiving a second of the pair of complementary signals, wherein the first and second path are coupled to a buffer circuit and each path comprises a capacitor, an inverter, a feedback resistor, and a switch in parallel to the feedback resistor.

11. A method, comprising:
   generating an amplified clock signal based on an input clock signal received from a clock generator circuit;
   filtering duty cycle distortion in the amplified clock signal and generating a filtered clock signal;
   generating a control signal after a period of time, wherein the filtered clock signal settles to a clock voltage during the period of time; and
   providing the filtered clock signal to one or more other devices based on the control signal.

12. The method of claim 11, wherein generating the control signal comprises:
   generating an internal clock signal based on the amplified clock signal, wherein the control signal is generated based on the internal clock signal.

13. The method of claim 12, generating the internal clock signal comprises:
   converting the amplified clock signal to a singled-ended clock signal.

14. The method of claim 12, wherein generating the control signal further comprises:
   counting clock cycles of the input clock signal, wherein the control signal is generated when a number of clock cycles matches a target number.

15. An apparatus, comprising:
   a clock generator circuit of a first integrated circuit device configured to generate a clock signal for a second integrated circuit device; and
   a clock receiver circuit of the second integrated circuit device that receives the clock signal, the clock receiver circuit including:
      an amplification circuit configured to generate an amplified clock signal based on the clock signal received from the clock generator circuit;
      a filter circuit configured to filter duty cycle distortion in the amplified clock signal and generate a filtered clock signal;
      a control circuit configured to generate a first control signal after a period of time, wherein the filtered clock signal settles to a clock voltage during the period of time; and
      a gating circuit configured to provide the filtered clock signal to one or more circuits of an integrated circuit device based on the first control signal.

16. The apparatus of claim 15, wherein the filter circuit comprises a capacitor, an inverter, a feedback resistor, and a switch.

17. The apparatus of claim 16, wherein the feedback resistor and the switch are coupled in parallel and the control circuit is further configured to generate a second control signal to close the switch, thereby reducing an impedance in a feedback path of the filter circuit.

18. The apparatus of claim 15, further comprising a converter that receives the amplified clock signal and converts the amplified clock signal to a CMOS (complimentary metal oxide semiconductor) clock signal; and a counter circuit that receives the CMOS clock signal and is configured to count a number of cycles of the CMOS clock signal and generate the timing signal.

19. The apparatus of claim 18, further comprising a frequency divider that alters frequency of the CMOS clock signal before the counter circuit receives the CMOS clock signal.

20. The apparatus of claim 15, wherein the control circuit comprises:

a counter configured to:

count clock cycles; and generate the first control signal when a number of clock cycles matches a target number.

* * * * *